United States Patent
Zinn et al.

(10) Patent No.: US 8,120,105 B2
(45) Date of Patent: Feb. 21, 2012

(54) LATERAL DMOS FIELD EFFECT TRANSISTOR WITH REDUCED THRESHOLD VOLTAGE AND SELF-ALIGNED DRIFT REGION

(75) Inventors: David R. Zinn, San Jose, CA (US); Paul M. Moore, Belmont, CA (US)

(73) Assignee: Micrel, Inc., San Jose, CA (US)

( * ) Notice: Subject to any disclaimer, the term of this patent is extended or adjusted under 35 U.S.C. 154(b) by 438 days.

(21) Appl. No.: 12/533,966

(22) Filed: Jul. 31, 2009

(65) Prior Publication Data
US 2011/0024839 A1  Feb. 3, 2011

(51) Int. Cl.
*H01L 29/772* (2006.01)

(52) U.S. Cl. ............... 257/336; 257/343; 257/E21.435; 257/E29.256; 438/289

(58) Field of Classification Search ........... 257/336, 257/343, E21.435, E29.256; 438/289
See application file for complete search history.

(56) References Cited

U.S. PATENT DOCUMENTS

| | | | |
|---|---|---|---|
| 2004/0108549 A1* | 6/2004 | Denison | 257/335 |
| 2004/0222488 A1* | 11/2004 | Abadeer et al. | 257/510 |
| 2009/0273028 A1* | 11/2009 | Mallikarjunaswamy et al. | 257/335 |

* cited by examiner

*Primary Examiner* — Steven J Fulk
(74) *Attorney, Agent, or Firm* — Patent Law Group LLP; Carmen C. Cook

(57) ABSTRACT

A method of forming a lateral DMOS transistor includes performing a low energy implantation using a first dopant type and being applied to the entire device area. The dopants of the low energy implantation are blocked by the conductive gate. The method further includes performing a high energy implantation using a third dopant type and being applied to the entire device area. The dopants of the high energy implantation penetrate the conductive gate and is introduced into the entire device active area including underneath the conductive gate. After annealing, a double-diffused lightly doped drain (DLDD) region is formed from the high and low energy implantations and is used as a drift region of the lateral DMOS transistor. The DLDD region overlaps with the body region at a channel region and interacts with the dopants of the body region to adjust a threshold voltage of the lateral DMOS transistor.

16 Claims, 5 Drawing Sheets

LATERAL DMOS FIELD EFFECT TRANSISTOR WITH REDUCED THRESHOLD VOLTAGE AND SELF-ALIGNED DRIFT REGION

FIELD OF THE INVENTION

The invention relates to lateral DMOS transistors and, in particular, to a lateral DMOS transistor with reduced threshold voltage and self-aligned drift region.

DESCRIPTION OF THE RELATED ART

Lateral double-diffused metal-oxide-semiconductor (LDMOS or lateral DMOS) transistors are commonly used in high-voltage applications (20 to 500 volts) because of their high breakdown voltage characteristics and compatibility with CMOS technology for low voltage devices. The channel region of the lateral DMOS transistor is separated from the drain terminal by a drift region. It is well known that by increasing the length of the drift region, the breakdown voltage of the lateral DMOS transistor can be increased accordingly.

Conventional lateral DMOS transistors tend to have high electric field at the gate and drain interface. The high electric field results when the maximum difference in voltage between the gate and the drain approaches the silicon impact ionization limit, causing the onset of "avalanche" breakdown. Furthermore, conventional lateral DMOS transistors tend to suffer from punch-through at the source/body interface. To avoid punch-through, higher boron doping levels have to be used in the body (DMOS) implant. Higher boron doping in the body region results in higher threshold voltage for the lateral DMOS transistor.

SUMMARY OF THE INVENTION

According to one embodiment of the present invention, a method of forming a lateral DMOS transistor includes providing a semiconductor layer of a first conductivity type, defining an active area in which the lateral DMOS transistor is formed, forming a conductive gate in the active area insulated from the semiconductor layer by a first dielectric layer where the conductive gate delineates a first region and a second region in the semiconductor layer, performing a first implantation using a first type of dopants of the first conductivity type where the first implantation is selectively applied to only the first region in the semiconductor layer, performing a second implantation using a second type of dopants of a second conductivity type where the second implantation is selectively applied to only the first region in the semiconductor layer, performing a third implantation using the first type of dopants of the first conductivity type where the third implantation is a low energy implantation and is applied to the entire active area and the dopants of the third implantation is blocked by the conductive gate and is introduced into the semiconductor layer in the first and second regions only, performing a fourth implantation using a third type of dopants of the first conductivity type where the fourth implantation is a high energy implantation and is applied to the entire active area and the dopants of the fourth implantation penetrates the conductive gate and is introduced into the semiconductor layer in the first and second regions and underneath the conductive gate. The method further includes annealing the semiconductor layer to form a source region from the first implantation, a body region from the second implantation where the source region is formed in the body region, and a double-diffused lightly doped drain region as a drift region from the third and fourth implantations. The double-diffused lightly doped drain region formed from the fourth implantation extends under the conductive gate into and overlaps with the body region at a channel region of the lateral DMOS transistor. The dopants of the double-diffused lightly doped drain region interacting with the dopants of the body region to adjust a threshold voltage of the lateral DMOS transistor.

According to another aspect of the present invention, a lateral DMOS transistor includes a semiconductor layer of a first conductivity type, a field oxide layer formed on the top surface of the semiconductor layer defining an active area in which the lateral DMOS transistor is formed, a conductive gate formed in the active area insulated from the semiconductor layer by a first dielectric layer where the conductive gate delineates a first region and a second region in the semiconductor layer, a body region of a second conductivity type formed in the first region of the semiconductor layer where a part of the body region extends underneath the conductive gate, a source region of the first conductivity type formed in the body region of the semiconductor layer where a part of the source region extends underneath the conductive gate, and a double-diffused lightly doped drain region of the first conductivity type formed in the second region of the semiconductor layer. The double-diffused lightly doped drain region is a drift region of the lateral DMOS transistor and a part of the double-diffused lightly doped drain region extends underneath the conductive gate into and overlaps with the body region at a channel region of the lateral DMOS transistor. Dopants of the double-diffused lightly doped drain region interact with dopants of the body region to adjust a threshold voltage of the lateral DMOS transistor.

The present invention is better understood upon consideration of the detailed description below and the accompanying drawings.

DETAILED DESCRIPTION OF THE PREFERRED EMBODIMENTS

In accordance with the principles of the present invention, a method for forming a lateral DMOS transistor uses blanket self-aligned drift region implantation steps to form a double-diffused lightly doped drain region for use as the drift region of the lateral DMOS transistor. In one embodiment, a low energy blanket self-aligned implantation and a high energy blanket self-aligned implantation are performed. The high energy blanket implantation penetrates the conductive gate of the transistor to extend the lightly doped drain region (drift region) into the channel region to overlap with the body region. At the overlap region, the dopants of the lightly doped drain region interact with the dopants of the body region to adjust the threshold voltage of the lateral DMOS transistor.

The use of the blanket self-aligned drift region enables the lateral DMOS transistor to optimize the transistor breakdown and punch-through characteristics. The lateral DMOS transistor of the present invention has the advantage of allowing enough voltage to drop across the drift region to achieve acceptable electric fields at the gate/drain interface and to create a well-defined and controllable body region sufficient to reduce the effects of punch-through while maintaining a reasonably low threshold voltage. More specifically, by counteracting the p-type body doping with the N-type drift region doping underneath the conductive gate, the threshold voltage of the lateral DMOS transistor is adjusted to the desired low voltage level while the punch-through voltage is maintained at a sufficiently high voltage level by the use of the desired p-type body doping level. In this manner, the electrical characteristics of the lateral DMOS transistor are optimized.

Furthermore, by using blanket implantation steps to form the lightly doped region being used as the drift region of the lateral DMOS transistor, the drift region of the lateral DMOS transistor is self-aligned to the conductive gate of the transistor. As thus formed, the lateral DMOS transistor of the present invention is capable of achieving a higher avalanche breakdown voltage than conventional transistor structures at the gate/drain interface while maintaining a sufficiently high punch-through voltage at the source/body interface.

Lateral double diffused metal-oxide-semiconductor (Lateral DMOS or LDMOS) field effect transistors (FET) are devices used primarily for power applications. In most applications, lateral DMOS transistors uses a lightly doped drain region as a drift region to reduce the concentration of electric field at the gate and drain interface. Most lateral DMOS transistors are NMOS devices. That is, the lateral DMOS transistors have N-type source region, N-type lightly doped drain region (NLDD), and a P-type body region. However, lateral DMOS transistors can also be formed as PMOS devices.

Figure 1:
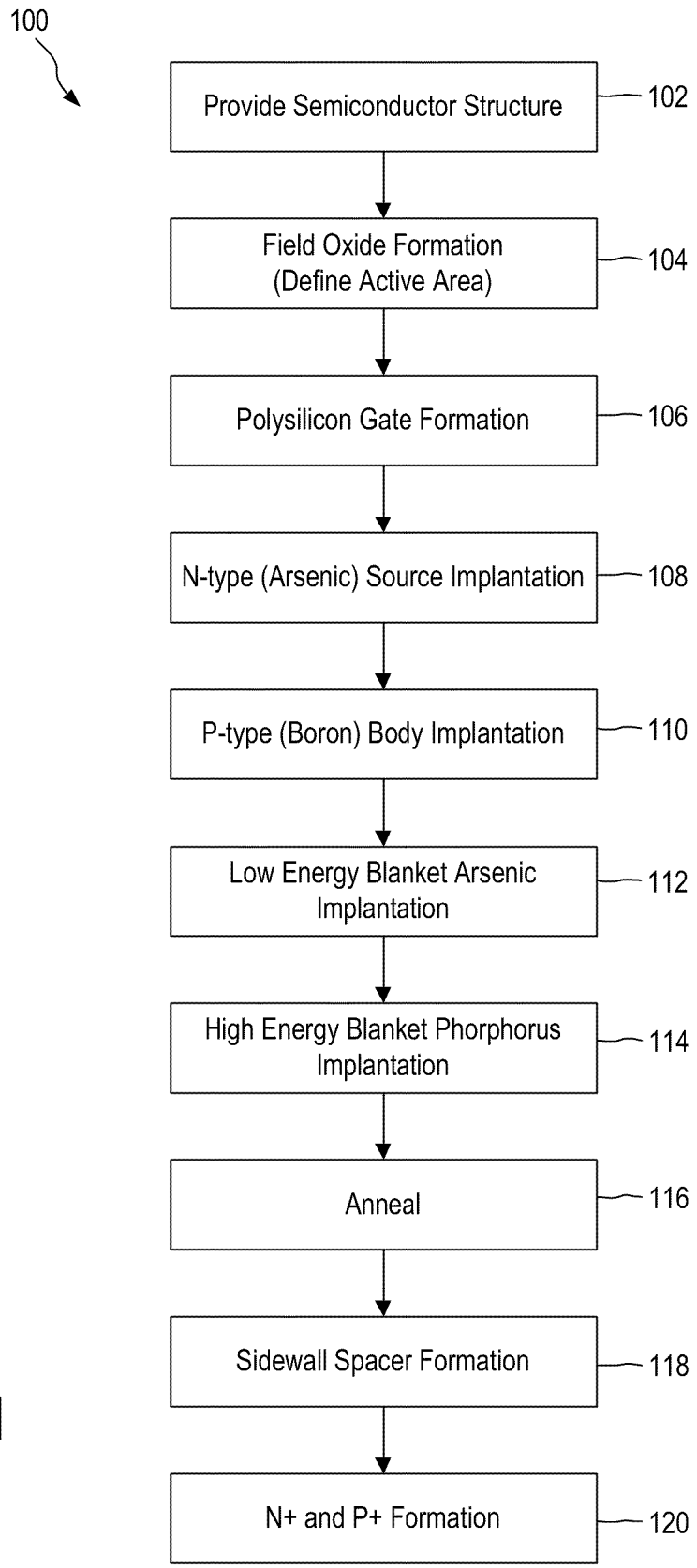
FIG. 1 is a flow chart illustrating the fabrication process for forming a lateral DMOS transistor according to one embodiment of the present invention.

FIG. 1 is a flow chart illustrating the fabrication process for forming a lateral DMOS transistor according to one embodiment of the present invention. In one embodiment, the fabrication process is 0.35 um polysilicon gate process. Method 100 will be described with reference to FIGS. 2-8 which are cross-sectional view of the semiconductor structure in which the lateral DMOS transistor is formed at different stages of the fabrication process.

Referring to FIG. 1, a semiconductor structure in which the lateral DMOS transistor is formed is provided. In the present embodiment (FIG. 2), the semiconductor structure 400 includes a P-type substrate 402, an N-type buried layer 404 formed in the substrate 402 and an N-type epitaxial (N-Epi) layer 406 formed on top of buried layer 404 and substrate 402. A field oxide layer 408 is then formed on the N-Epi layer 406 to define the active area of the transistor device. That is, field oxide layer 408 surrounds the active area in which the lateral DMOS transistor is to be formed.

Figure 2:
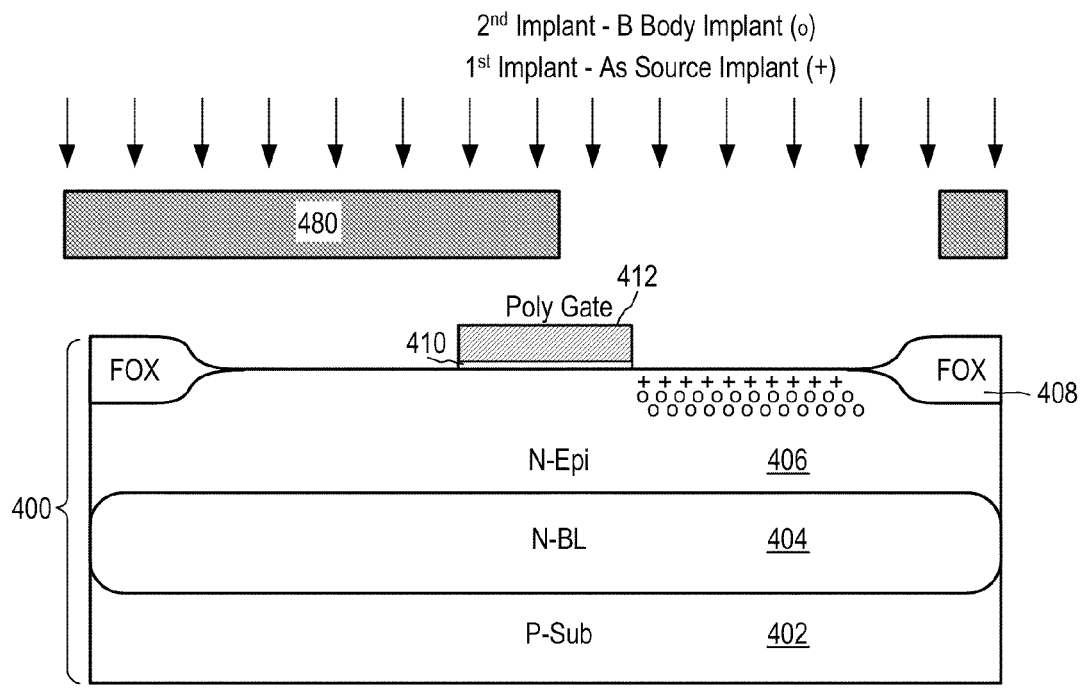
FIG. 2 is a cross-sectional view of a semiconductor structure in the intermediate step of the fabrication process of FIG. 1 where the source and body implants of the lateral DMOS transistor are carried out according to one embodiment of the present invention.

Next, the conductive gate is formed (step 106). In the present embodiment, the conductive gate is a polysilicon gate. First, a gate dielectric layer 410, typically a silicon oxide layer, is formed on the N-Epi layer 406 in the active area. Then, a polysilicon layer is deposited and the polysilicon layer and the gate dielectric layer are patterned to form the polysilicon gate structure 412 as shown in FIG. 2. The polysilicon gate 412 delineates the active area into a first region and a second region in which the source and drain regions of the lateral DMOS transistor are to be formed.

After the polysilicon gate definition, a source region mask 480 is applied which covers all of the active area but exposes the first region. Then, an N-type source implantation step (step 108) is carried out through mask 480 and using arsenic as dopants to form the source region of the lateral DMOS transistor. The implant energy of the source implantation is selected so that the arsenic implants do not penetrate the poly gate 412. The source implantation is thus self-aligned to the edge of the poly gate 412. Using the same mask 480, a P-type body implantation step (step 110) is also carried out. The P-type body implantation is performed using boron as dopants to form the body region of the lateral DMOS transistor. As shown in FIG. 2, as a result of the source implantation and body implantation, N-type dopants (arsenic) are introduced in the first region of the active area near the surface of the semiconductor structure and P-type dopants (boron) are introduced into the same area but at a deeper depth than the N-type dopants.

Figure 3:
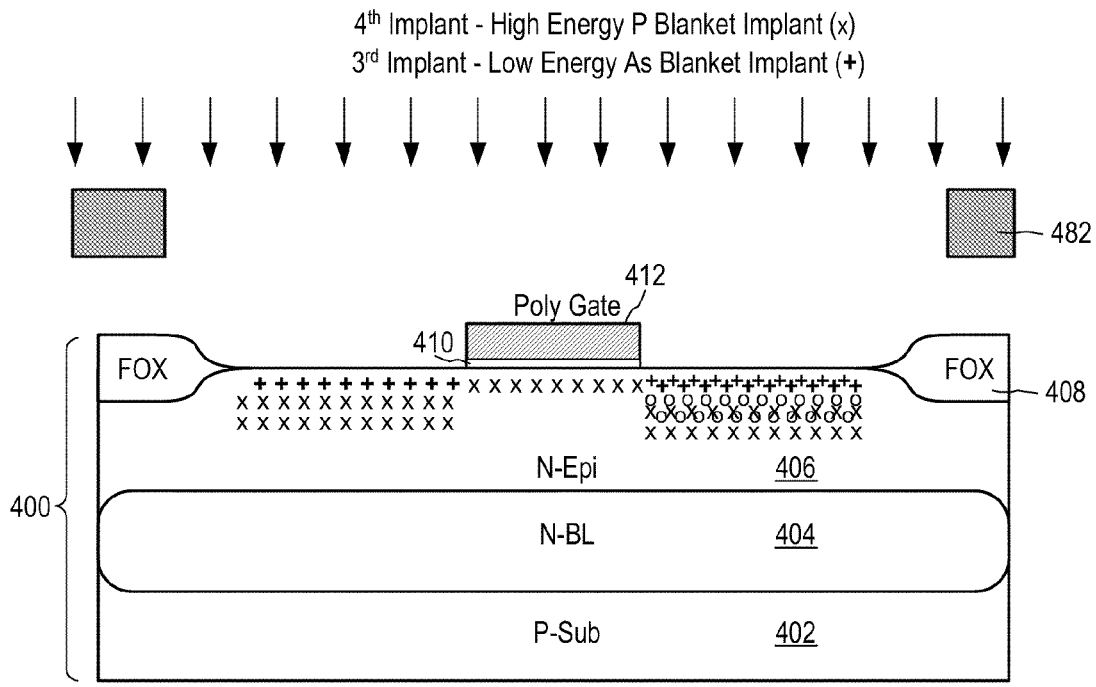
FIG. 3 is a cross-sectional view of a semiconductor structure in the intermediate step of the fabrication process of FIG. 1 where the blanket arsenic and phosphorus implants of the lateral DMOS transistor are carried out according to one embodiment of the present invention.

Turning now to FIG. 3, mask 480 is removed and a second mask 482 is applied to semiconductor structure 400. Mask 482 exposes the entire active area of the lateral DMOS transistor but may cover other areas (not shown) of the semiconductor structure. Using mask 482, a low energy blanket arsenic implantation (step 112) is carried out. In the present description, a "blanket" implantation refers to an implantation that is introduced to the entire active area of the lateral DMOS device. The blanket implantation may not be introduced to the entire surface of the semiconductor structure in areas where the lateral DMOS transistor is not formed. Therefore, the low energy blanket arsenic implantation step introduces arsenic dopants over all of the active area of the lateral DMOS transistor. However, because the arsenic implantation step is low energy, the arsenic implants do not penetrate the polysilicon gate 412. The arsenic implants are therefore introduced to the first and second regions of the active areas and are self-aligned to the polysilicon gate 412.

Next, using the same mask 482, a high energy blanket phosphorus implantation (step 114) is carried out. The high energy blanket phosphorus implantation step introduces phosphorus dopants over all of the active area of the lateral DMOS transistor. Because the phosphorus implantation step is high energy, the phosphorus implants penetrate the polysilicon gate 412. The phosphorus implants are therefore introduced to the first and second regions of the active areas and also imbed into the silicon area near the surface under the polysilicon gate 412. FIG. 3 illustrates the results of the four implantation steps (108, 110, 112 and 114) and the approximate location of the implanted dopants in the active areas of the lateral DMOS transistor.

Implantation steps 112 and 114 are used to form the double-diffused N-type lightly doped drain (DNLDD) region of the lateral DMOS transistor. The DNLDD region of the lateral DMOS transistor forms the drift region of the transistor. As thus formed, the arsenic implantation defines the resistance of the drain along the surface of the N-Epi layer 406 where majority of the current will flow while the phosphorus implantation defines the amount of threshold voltage adjust being applied to counter-dope the boron implant for the body, as will be explained in more detail below.

Figure 4:
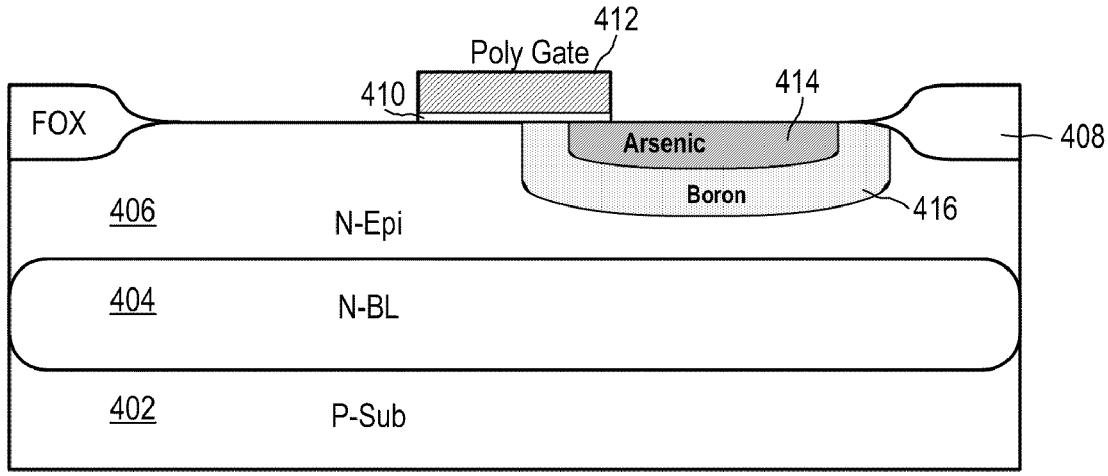
FIG. 4 is a cross-sectional view of the semiconductor structure of FIG. 3 illustrating the profile of the source and body implants after annealing according to one embodiment of the present invention.
Figure 5:
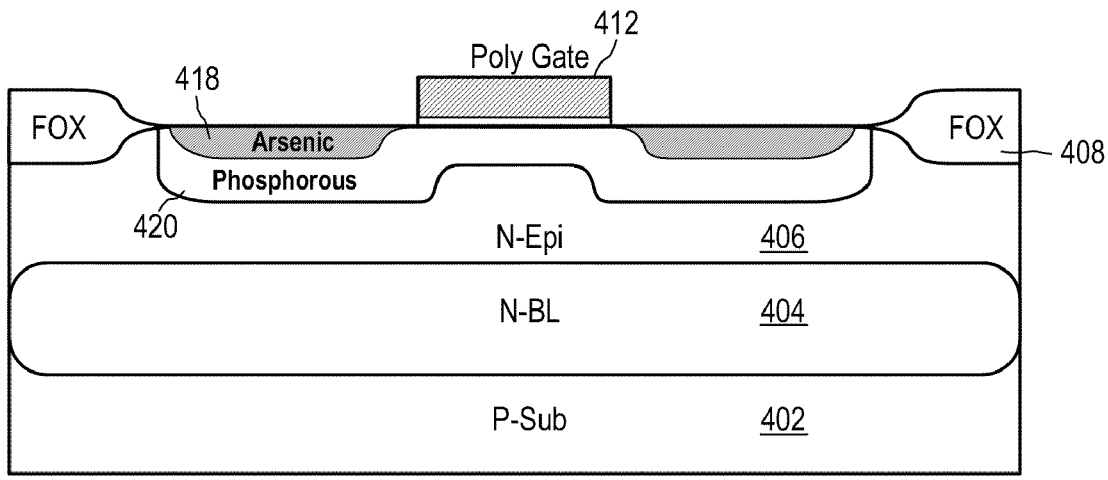
FIG. 5 is a cross-sectional view of the semiconductor structure of FIG. 3 illustrating the profile of the blanket arsenic and phosphorus implants after annealing according to one embodiment of the present invention.

The semiconductor structure 400 is then subjected to an anneal process (step 116) where the semiconductor structure is heated to allow the implanted dopants to diffuse and to repair any lattice damage resulted from the implantation steps. FIG. 4 is a cross-sectional view of the semiconductor structure of FIG. 3 illustrating the profile of the source and body implants after annealing according to one embodiment of the present invention. FIG. 5 is a cross-sectional view of the semiconductor structure of FIG. 3 illustrating the profile of the blanket arsenic and phosphorus implants after annealing according to one embodiment of the present invention. FIGS. 4 and 5 each illustrates only a portion of the total doping profiles and are provided for clarity purpose. The combined doping profile is shown in FIG. 6 and the resulting doped regions thus formed are shown in FIG. 7.

Referring first to FIG. 4, after annealing, the arsenic implants from the source implantation step form an N-type source region 414 and the boron implants from the body implantation step form a P-type body region 416. The boron dopants distributes wider and deeper than the arsenic dopants. Therefore, source region 414 is formed inside body region 416.

Now turning to FIG. 5, after annealing, the arsenic implants from the low energy blanket arsenic implantation step form a shallow N-type region 418 and the phosphorus implants from the high energy blanket phosphorus implantation step form a deeper N-type region 420. N-type regions 418 and 420 are formed on both sides of polysilicon gate 412 due to the device-wide blanket nature of the two implantation steps.

Figure 6:
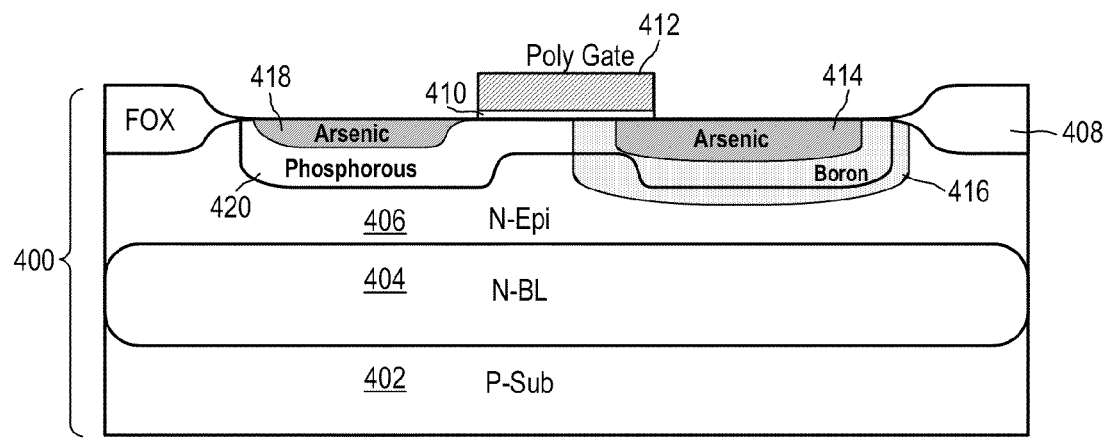
FIG. 6 is a cross-sectional view of the semiconductor structure of FIG. 3 illustrating the profile of the source, body, blanket arsenic and phosphorus implants after annealing according to one embodiment of the present invention.
Figure 7:
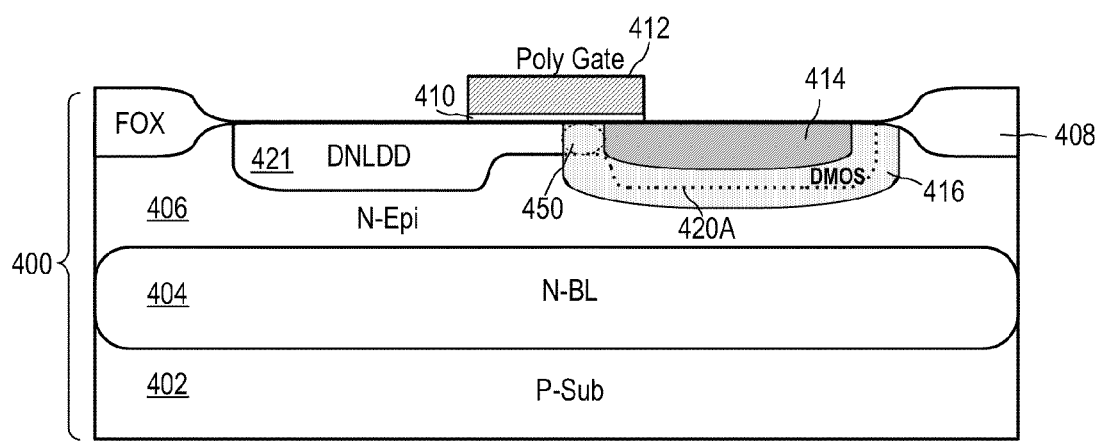
FIG. 7 is a cross-sectional view of the semiconductor structure illustrating the resulting diffusion regions in the lateral DMOS transistor after annealing according to one embodiment of the present invention.

FIG. 6 illustrates the diffusion regions of FIGS. 4 and 5 superimposed on each other. As shown in FIG. 6, the N-type region 418 on the source side of the transistor merges with the source region 414. The N-type region 420 extends into the channel region of the lateral DMOS transistor and overlaps with the body region 416. FIG. 7 illustrates the profiles of the diffusion regions in the lateral DMOS transistor after annealing. The N-type region 418 (on the drain side) and N-type region 420 merge to form the DLDD region 421 of the lateral DMOS. The DNLDD region 421 extends into the channel region of the transistor and overlaps with the body region 416 at an area 450 in the channel region of the lateral DMOS transistor. Other portion of the N-type region formed by the phosphorus implants, denoted by the dotted line region 420A, are washed out by the P-type doping of the body region and do not impact the electrical characteristics of the lateral DMOS transistor. However, at area 450 in the channel region of the lateral DMOS transistor, the N-type dopants from the high energy blanket phosphorus implantation act to counter-dope the P-type dopants of the body region. Accordingly, the threshold voltage of the lateral DMOS transistor is set by the P-type doping concentration of the body region and modified by the N-type doping concentration of the DNLDD region.

As thus formed, the threshold voltage of the lateral DMOS transistor is adjusted by adjusting the doping concentration of the DNLDD region 421 while the doping concentration of the body region can be selected to maintain the desired punch-through voltage. The N-type dopants of the DNLDD region 421 acts to counter-dope the P-type dopants of the body region in the overlapped area of the channel region. In this manner, both the threshold voltage and the punch-through voltage are optimized for the lateral DMOS transistor.

Figure 8:
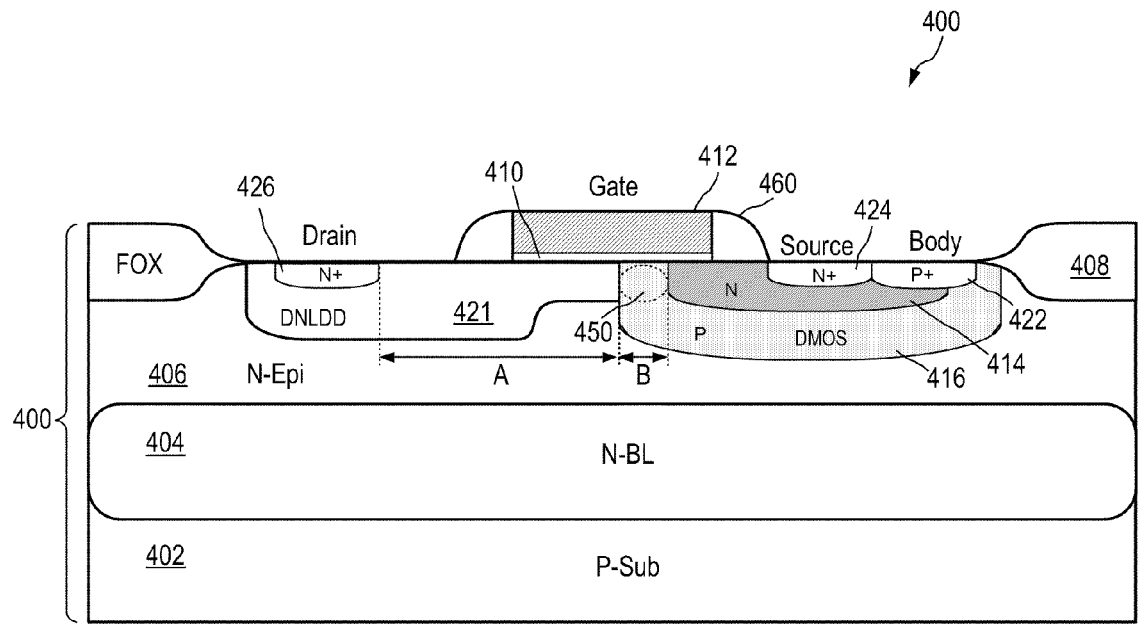
FIG. 8 is a cross-sectional view of the lateral DMOS transistor formed using the fabrication process of FIG. 1 according to one embodiment of the present invention.

After annealing of the implants, method 100 continues with gate sidewall spacer formation (step 118) and the formation of the heavily doped N+ and P+ regions (step 120). Referring to FIG. 8, sidewall spacers 460 are formed adjacent the sidewalls of polysilicon gate 412 (step 118). Then, a heavily doped N+ diffusion region 424 is formed in the source region 414 and is self-aligned to the sidewall spacer 460. The N+ region 424 is used as the source contact diffusion region. A heavily doped N+ diffusion region 426 is formed in the DNLDD region 421 and is used as the drain contact diffusion region. In the present embodiment, drain contact diffusion region 426 is formed spaced apart from the polysilicon gate 412 to realize an extended drift region for the lateral DMOS transistor. A heavily doped P+ diffusion region 422 is formed at least partially in the body region 416 to form a body contact diffusion region. FIG. 8 illustrates the final structure of the lateral DMOS transistor 400 formed using method 100 in according to one embodiment of the present invention. Other dielectric and conductive layers (not shown) can be added to the lateral DMOS transistor of FIG. 8, such as oxide layers and metal layers, to make contacts to the drain, source and body terminals of the lateral DMOS transistor and to make interconnection with other circuitry on the substrate 402.

In lateral DMOS transistor 400, the distance A is the area in which the DNLDD implant sets the resistance of the drift region of the transistor. Area 450, denoted as distance B, is the region where the DNLDD implant adjusts the threshold voltage of the lateral DMOS transistor 400.

Figure 9:
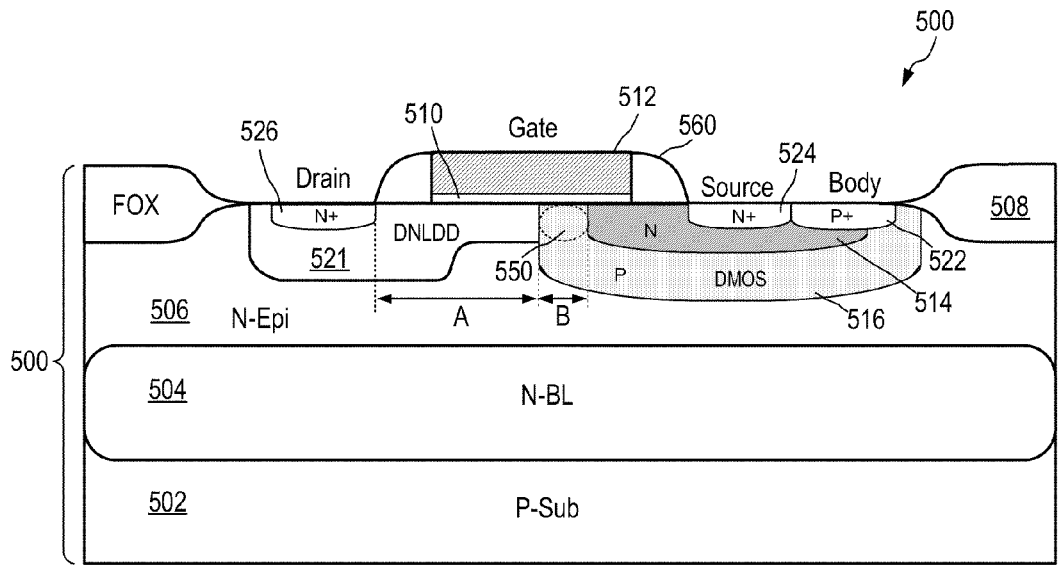
FIG. 9 is a cross-sectional view of the lateral DMOS transistor formed using the fabrication process of FIG. 1 according to an alternate embodiment of the present invention.

In the embodiment shown in FIG. 8, the drain contact diffusion region 426 is formed spaced apart from the polysilicon gate 412. In an alternate embodiment of the lateral DMOS transistor of the present invention and shown in FIG. 9, the heavily doped N+ drain contact diffusion region 526 is formed self-aligned to the sidewall spacer 560 of the polysilicon gate 512. Lateral DMOS transistor 500 thus formed has a shorter drift region distance (A) as compared to lateral DMOS transistor 400 of FIG. 8. However, the overall device size is reduced and the DNLDD region 521 underneath the sidewall spacer 560 and the polysilicon gate 512 typically provides sufficient voltage drop and protection against avalanche breakdown. Area 550 serves the same function of providing adjustment to the threshold voltage of the lateral DMOS transistor 500.

The above detailed descriptions are provided to illustrate specific embodiments of the present invention and are not intended to be limiting. Numerous modifications and variations within the scope of the present invention are possible. The present invention is defined by the appended claims.

We claim:
1. A method of forming a lateral DMOS transistor, comprising:
   providing a semiconductor layer of a first conductivity type;
   defining an active area in which the lateral DMOS transistor is formed;
   forming a conductive gate in the active area insulated from the semiconductor layer by a first dielectric layer, the conductive gate delineating a first region and a second region in the semiconductor layer;
   performing a first implantation using a first type of dopants of the first conductivity type, the first implantation being selectively applied to only the first region in the semiconductor layer;

performing a second implantation using a second type of dopants of a second conductivity type, the second implantation being selectively applied to only the first region in the semiconductor layer;

performing a third implantation using the first type of dopants of the first conductivity type, the third implantation being a low energy implantation and being applied to the entire active area, the dopants of the third implantation being blocked by the conductive gate and being introduced into the semiconductor layer in the first and second regions only;

performing a fourth implantation using a third type of dopants of the first conductivity type, the fourth implantation being a high energy implantation and being applied to the entire active area, the dopants of the fourth implantation penetrating the conductive gate and being introduced into the semiconductor layer in the first and second regions and underneath the conductive gate;

annealing the semiconductor layer to form a source region from the first implantation, a body region from the second implantation, the source region being formed in the body region, and a double-diffused lightly doped drain region as a drift region from the third and fourth implantations, the double-diffused lightly doped drain region formed from the fourth implantation extending under the conductive gate into and overlapping with the body region at a channel region of the lateral DMOS transistor, the dopants of the double-diffused lightly doped drain region interacting with the dopants of the body region to adjust a threshold voltage of the lateral DMOS transistor.

2. The method of claim 1, further comprising:
forming sidewall spacers adjacent to the conductive gate;
forming a first heavily doped region of the first conductivity type in the source region of the semiconductor layer and self-aligned to the sidewall spacer of the conductive gate;
forming a second heavily doped region of the first conductivity type in the drain region of the semiconductor layer; and
forming a third heavily doped region of the second conductivity type at least partially in the body region of the semiconductor layer.

3. The method of claim 2, wherein forming a second heavily doped region of the first conductivity type in the drain region of the semiconductor layer comprises forming the second heavily doped region apart from the conductive gate.

4. The method of claim 2, wherein forming a second heavily doped region of the first conductivity type in the drain region of the semiconductor layer comprises forming the second heavily doped region self-aligned to the sidewall spacer of the conductive gate.

5. The method of claim 1, further comprising:
forming the first dielectric layer on the top surface of the semiconductor layer, the first dielectric layer forming a gate dielectric layer of the lateral DMOS transistor.

6. The method of claim 1, wherein defining an active area in which the lateral DMOS transistor is formed comprises defining the active area using a field oxide layer, the field oxide layer surrounding the active area.

7. The method of claim 1, wherein the semiconductor layer comprises an epitaxial layer of the first conductivity type.

8. The method of claim 1, wherein the first conductivity type is P-type and the second conductivity type is N-type.

9. The method of claim 1, wherein the first conductivity type is N-type and the second conductivity type is P-type, the first type of dopants of the first conductivity type comprises arsenic, the second type of dopants of the second conductivity type comprises boron and the third type of dopants of the first conductivity type comprises phosphorus.

10. A lateral DMOS transistor, comprising:
a semiconductor layer of a first conductivity type;
a field oxide layer formed on the top surface of the semiconductor layer defining an active area in which the lateral DMOS transistor is formed;
a conductive gate formed in the active area insulated from the semiconductor layer by a first dielectric layer, the conductive gate delineating a first region and a second region in the semiconductor layer;
a body region of a second conductivity type formed in the first region of the semiconductor layer, a part of the body region extending underneath the conductive gate;
a source region of the first conductivity type formed in the body region of the semiconductor layer, a part of the source region extending underneath the conductive gate; and
a double-diffused lightly doped drain region of the first conductivity type formed in the second region of the semiconductor layer, the double-diffused lightly doped drain region being a drift region of the lateral DMOS transistor, a part of the double-diffused lightly doped drain region extending underneath the conductive gate into and overlapping with the body region at a channel region of the lateral DMOS transistor, dopants of the double-diffused lightly doped drain region interacting with dopants of the body region to adjust a threshold voltage of the lateral DMOS transistor.

11. The lateral DMOS transistor of claim 10, further comprising:
sidewall spacers formed adjacent to the conductive gate;
a first heavily doped region of the first conductivity type formed in the source region of the semiconductor layer and self-aligned to the sidewall spacer of the conductive gate;
a second heavily doped region of the first conductivity type formed in the drain region of the semiconductor layer; and
a third heavily doped region of the second conductivity type formed at least partially in the body region of the semiconductor layer.

12. The lateral DMOS transistor of claim 11, wherein the second heavily doped region is formed apart from the conductive gate.

13. The lateral DMOS transistor of claim 11, wherein the second heavily doped region is formed self-aligned to the sidewall spacer of the conductive gate.

14. The lateral DMOS transistor of claim 10, wherein the semiconductor layer comprises an epitaxial layer of the first conductivity type.

15. The lateral DMOS transistor of claim 10, wherein the first conductivity type is P-type and the second conductivity type is N-type.

16. The lateral DMOS transistor of claim 10, wherein the first conductivity type is N-type and the second conductivity type is P-type, the double-diffused lightly doped drain region being formed from a first low energy implantation step using arsenic and a second high energy implantation step using phosphorus.

* * * * *